United States Patent
Tsau et al.

(10) Patent No.: US 9,105,644 B2
(45) Date of Patent: Aug. 11, 2015

(54) APPARATUS AND METHOD FOR FORMING ALIGNMENT FEATURES FOR BACK SIDE PROCESSING OF A WAFER

(71) Applicant: Analog Devices, Inc., Norwood, MA (US)

(72) Inventors: Christine H. Tsau, Medford, MA (US); William David Sawyer, Littleton, MA (US); Thomas Kieran Nunan, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/948,408

(22) Filed: Jul. 23, 2013

(65) Prior Publication Data

US 2015/0028499 A1    Jan. 29, 2015

(51) Int. Cl.
*H01L 21/76* (2006.01)
*H01L 23/544* (2006.01)
*H01L 21/768* (2006.01)
*H01L 21/78* (2006.01)

(52) U.S. Cl.
CPC ........ *H01L 23/544* (2013.01); *H01L 21/76898* (2013.01); *H01L 21/78* (2013.01)

(58) Field of Classification Search
USPC ....... 438/401, 462, 637–640, 668, FOR. 385; 257/E21.577, E21.578, 257/E21.585–E21.588, E23.179
See application file for complete search history.

(56) References Cited

U.S. PATENT DOCUMENTS

| | | | | |
|---|---|---|---|---|
| 5,192,716 A * | 3/1993 | Jacobs | ............................. | 29/832 |
| 5,866,447 A * | 2/1999 | Liu | ............................... | 438/229 |
| 5,893,744 A | 4/1999 | Wang | ............................. | 438/401 |
| 5,925,924 A | 7/1999 | Cronin et al. | .................. | 257/622 |
| 6,861,186 B1 | 3/2005 | Pagette et al. | .................... | 430/22 |
| 7,494,830 B2 | 2/2009 | Liu et al. | .......................... | 438/16 |
| 7,611,960 B2 | 11/2009 | Liu et al. | ........................ | 438/401 |
| 2004/0063237 A1 | 4/2004 | Yun et al. | ......................... | 438/48 |
| 2004/0097002 A1 | 5/2004 | Pogge et al. | ..................... | 438/52 |
| 2005/0059255 A1 | 3/2005 | Varnerin, III et al. | ......... | 438/720 |
| 2010/0224876 A1 | 9/2010 | Zhu | .................................. | 257/52 |
| 2011/0149062 A1 | 6/2011 | Capidell et al. | .................. | 348/87 |
| 2012/0175789 A1 | 7/2012 | Farooq et al. | .................. | 257/797 |
| 2013/0252416 A1* | 9/2013 | Takeda et al. | .................. | 438/630 |

OTHER PUBLICATIONS

Edelstein et al., "Process Integration Aspects of Back Illuminated CMOS Imagers Using Smart Stacking™ Technology with Best in Class Direct Bonding," 2011 Int'l Image Sensor Workshop , Jun. 8-11, 2011, 4 pages.

International Searching Authority, International Search Report—International Application No. PCT/US2014/47549, dated Sep. 30, 2014, together with the Written Opinion of the International Searching Authority, 8 pages.

* cited by examiner

*Primary Examiner* — Jasmine Clark
(74) *Attorney, Agent, or Firm* — Sunstein Kann Murphy & Timbers LLP

(57) ABSTRACT

A method for forming an alignment feature for back side wafer processing in a wafer fabrication process involves forming a trench into but not entirely through a wafer from a top side of the wafer; forming a contrasting material on surfaces of the trench; and grinding a bottom side of the wafer to expose the trench using the handling wafer to handle the wafer during such grinding, wherein the contrasting material lining the exposed trench provides an alignment reference for precise alignment of the wafer for back side processing the wafer.

10 Claims, 5 Drawing Sheets

APPARATUS AND METHOD FOR FORMING ALIGNMENT FEATURES FOR BACK SIDE PROCESSING OF A WAFER

FIELD OF THE INVENTION

The present invention relates generally to wafer fabrication processes and more particularly to wafer fabrication processes for wafer alignment for back side wafer processing.

BACKGROUND OF THE INVENTION

For fabrication of wafer devices (e.g., MEMS devices or CMOS devices), it is often necessary or desirable to process both sides of a wafer, with features on one side of the wafer aligned with corresponding features on the other side of the wafer. One way to accomplish such alignment involves the use of an alignment tool using a 1× photo mask with infrared (IR) capabilities. The alignment accuracy of such a tool is generally between around 5um (micrometers or microns). If more precise alignment is desired, a stepper tool with IR capability may be used. Conventional steppers do not have IR capability, so the use of a stepper tool with IR capabilities generally would add cost and complexity to the fabrication process.

SUMMARY OF EXEMPLARY EMBODIMENTS

In certain embodiments, a method for forming an alignment feature for back side wafer processing in a wafer fabrication process involves forming a trench into but not entirely through a wafer from a top side of the wafer, forming a contrasting material on surfaces of the trench, and grinding a bottom side of the wafer to expose the trench, wherein the contrasting material lining the exposed trench provides an alignment reference for precise alignment of the wafer for back side processing the wafer.

In various alternative embodiments, the contrasting material may include an oxide or a nitride. The contrasting material may be formed by oxidation or deposition. The method may further involve filling the trench with a protective material, such as polysilicon or an electrically conductive material, after forming the contrasting material. Grinding the bottom side of the wafer to expose the trench may involve bonding a handling wafer directly or indirectly to the top side of the wafer and using the handling wafer to handle the wafer during such grinding. The wafer may be one of a number of wafers in a wafer stack. The wafer may be a silicon-on-insulator (SOI) wafer, and wherein the trench extends through a top device layer and a buried oxide layer of the SOI wafer into, but not completely through, a bottom handle layer of the SOI wafer. The alignment feature may be placed in a scribe area of the wafer that is excluded from wafer devices formed from the wafer or may be included in a wafer device formed from the wafer. The method may further involve aligning the wafer in a wafer processing machine for back side processing of the wafer, wherein the wafer processing machine includes an alignment tool, and wherein the contrasting material of the exposed trench is an alignment reference used by the alignment tool to align the wafer.

Certain other embodiments include apparatus comprising a wafer having a trench formed from a top side of the wafer and lined with a contrasting material, the trench exposed from a bottom side of the wafer, wherein the contrasting material provides an alignment reference for precise alignment of the wafer by an alignment tool for back side processing the wafer.

In various alternative embodiments, the contrasting material may include an oxide or a nitride. The lined trench may be filled with a protective material, such as polysilicon or an electrically conductive material. The wafer may include a single-crystal wafer, a silicon-on-insulator (SOI) wafer, or a wafer in a wafer stack. The alignment feature may be placed in a scribe area of the wafer that is excluded from wafer devices formed from the wafer or may be included in a wafer device formed from the wafer.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Figure 1:
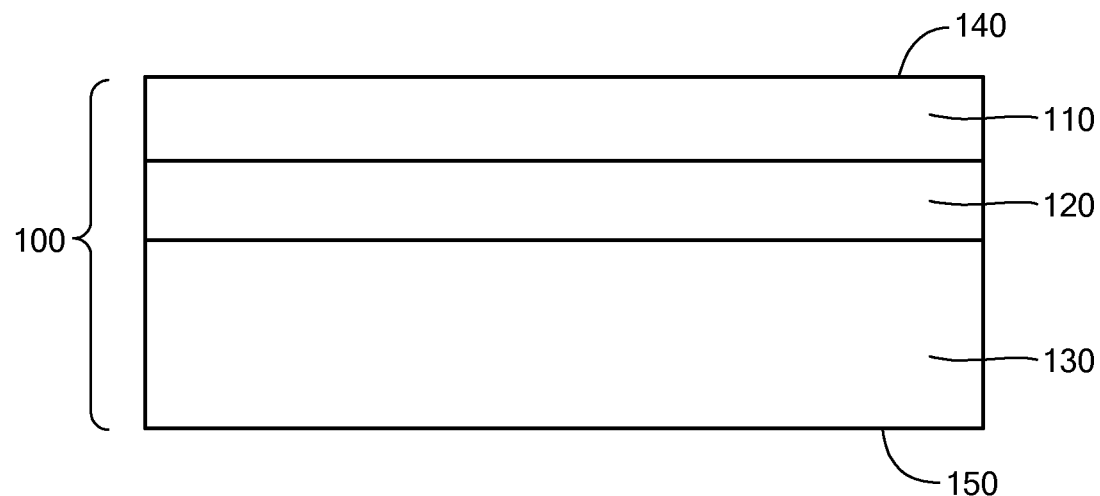
FIG. 1 is a schematic diagram showing a cross-sectional view of a SOI wafer, as known in the art.

Embodiments of the present invention allow for very precise alignment (e.g., under around 1-5 microns) of a wafer for back side processing of the wafer (e.g., for fabrication of MEMS devices, CMOS devices, or other wafer devices). Specifically, one or more alignment features are formed from the front (top) side of a wafer for use in aligning the wafer for back (bottom) side processing using an alignment tool such as a conventional stepper without IR capabilities or a 1× aligner. The alignment features are formed by forming one or more trenches into but not entirely through the wafer from the front (top) side of the wafer, forming a contrasting material (e.g., an oxide or nitride) on surfaces of the trench(es), and grinding the bottom (back) side of the wafer to expose the trench(es). The contrasting material lining the exposed trench(es) provides alignment references for an alignment tool for precise alignment of the wafer during back side processing the wafer. Prior to grinding, the trench(es) may be filled with a protective material (e.g., polysilicon) in order to prevent materials from later fabrication processes (e.g., photoresist) from becoming trapped in the trench(es) and causing problems during subsequent fabrication processes. A handling wafer may be bonded directly or indirectly to the top side of the wafer (e.g., a dummy handling wafer as described in United States Patent Application Publication No. 2004/0063237, which is hereby incorporated herein by reference in its entirety) for use in handling the wafer during grinding and/or back side processing of the wafer. Such a handling wafer may be permanently bonded to the wafer or may be removed after grinding and/or backside processing.

Various embodiments of the present invention may be used with various types of wafers, such as single-crystal wafers (e.g., silicon wafers), silicon-on-insulator (SOI) wafers, or wafer stacks (i.e., multiple wafers bonded directly or indirectly to one another in a stack configuration). Various material layers may be formed on or from the front side of the wafer prior to formation of the trench(es), in which case the trench(es) may be formed through such material layer(s) and into/through one or more layers of the wafer(s). Trench(es) may be formed to any depth necessary or desirable for a particular fabrication process flow based on various factors such as the type and/or thickness of the wafer, the material layer(s) through which the trench(es) are formed, and the amount of backside grinding to be performed. In certain embodiments, such alignment features are formed in a thick wafer, such as a silicon-on-insulator (SOI) wafer, where the deep trenches formed from the top side of the wafer are generally greater than around 100 microns deep (typically between around 100-500 microns deep, although deeper or shallower trenches may be formed in various embodiments) and extend through the top device layer and buried oxide layer of the SOI wafer into, but not completely through, the bottom handle layer of the SOI wafer. It should be noted that the precision with which the wafer can be aligned for back side processing using the alignment features is dependent, to some degree, on the precision with which the trench(es) can be formed and specifically on how steep and straight the trench sides can be formed. Thus, in certain embodiments, a deep reactive-ion etching (DRIE) process or other accurate deep etching process may be used to create deep, steep-sided trenches.

It should be noted that alignment features need not be included in a final device fabricated from the wafer. Thus, in certain exemplary embodiments, some or all of the alignment features may be situated outside of the wafer devices being fabricated, such as in a "scribe" area of the wafer that is removed during dicing or other separation of wafer devices.

It also should be noted that some or all of the alignment features may be filled with an electrically conductive material and used for electrical connection (e.g., as a "through-silicon via" or TSV) in addition to being used for alignment.

An exemplary process for forming alignment features in an SOI wafer is now described with reference to FIGS. 1-7, although it will be apparent to a skilled artisan how the process can be applied more generally to other types of wafers.

FIG. 1 is a schematic diagram showing a cross-sectional view of a SOI wafer 100, as known in the art. The SOI wafer 100 includes a top silicon device layer 110 defining a top surface 140, a middle (buried) oxide layer 120, and a bottom silicon handle layer 130 defining a bottom surface 150.

Figure 2:
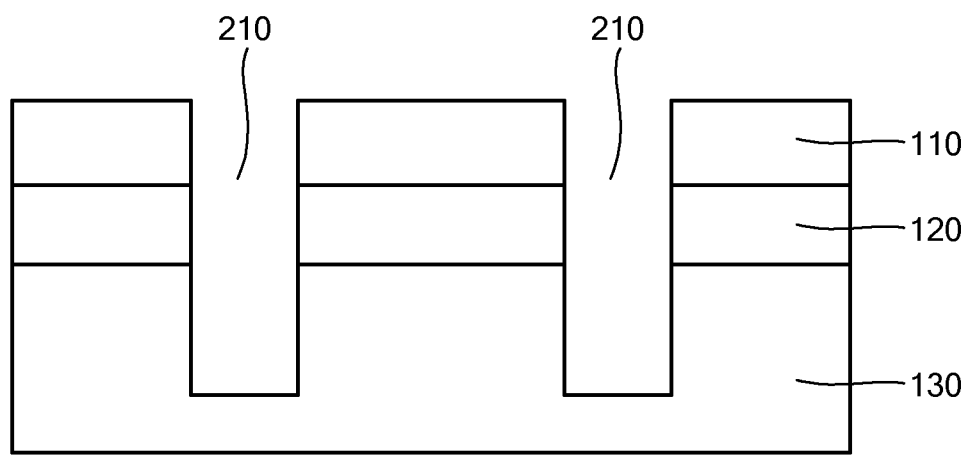
FIG. 2 is a schematic diagram showing deep trenches formed from the top side of the SOI wafer through the top device layer and buried oxide layer into the bottom handle layer.

FIG. 2 is a schematic diagram showing deep trenches 210 formed from the top side 140 of the SOI wafer 100 through the top device layer 110 and buried oxide layer 120 into the bottom handle layer 130. It should be noted that the trenches 210 may be formed in a single etching step or in multiple etching steps.

Figure 3:
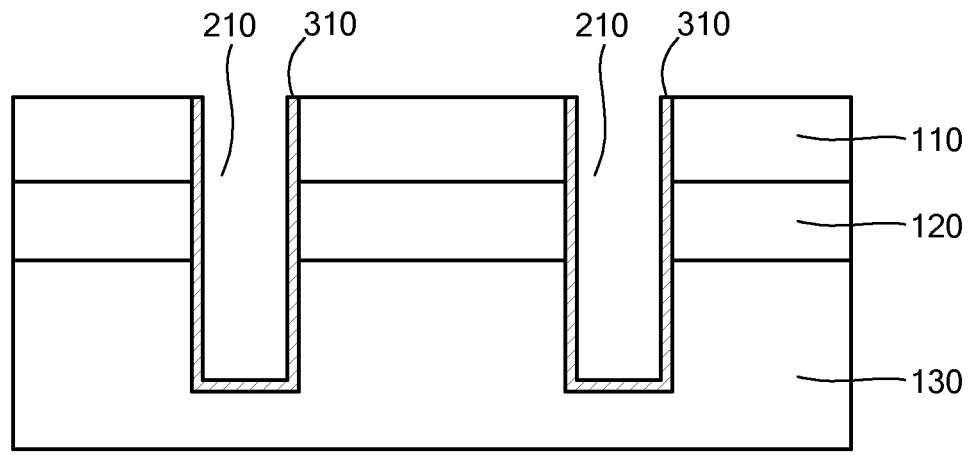
FIG. 3 is a schematic diagram showing a contrasting material formed on surfaces of the deep trenches.

FIG. 3 is a schematic diagram showing a contrasting material 310 formed on surfaces of the deep trenches 210. As discussed above, the contrasting material may be, for example, an oxide or a nitride. An oxide may be formed, for example, by oxidation or deposition.

Figure 4:
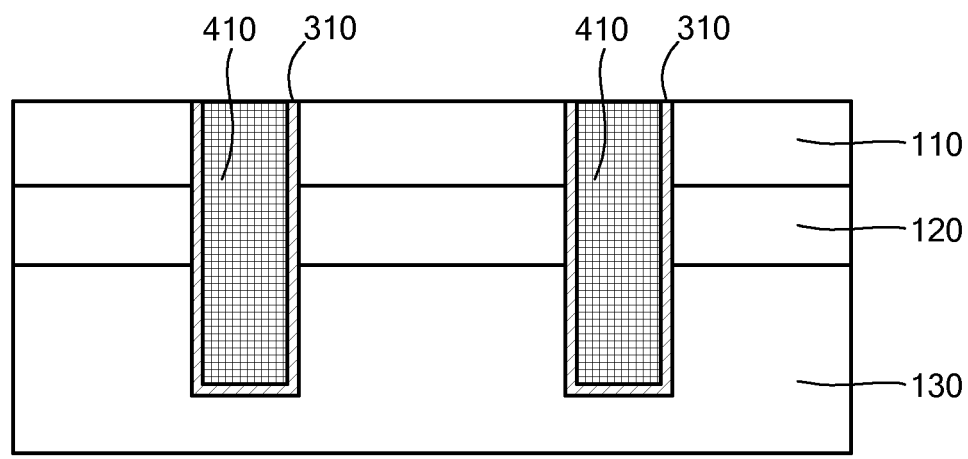
FIG. 4 is a schematic diagram showing the trenches filled with a protective material.

FIG. 4 is a schematic diagram showing the trenches 210 filled with a protective material 410, such as polysilicon or a metal. Filling of the trenches 210 with a protective material may be omitted in certain embodiments.

Figure 5:
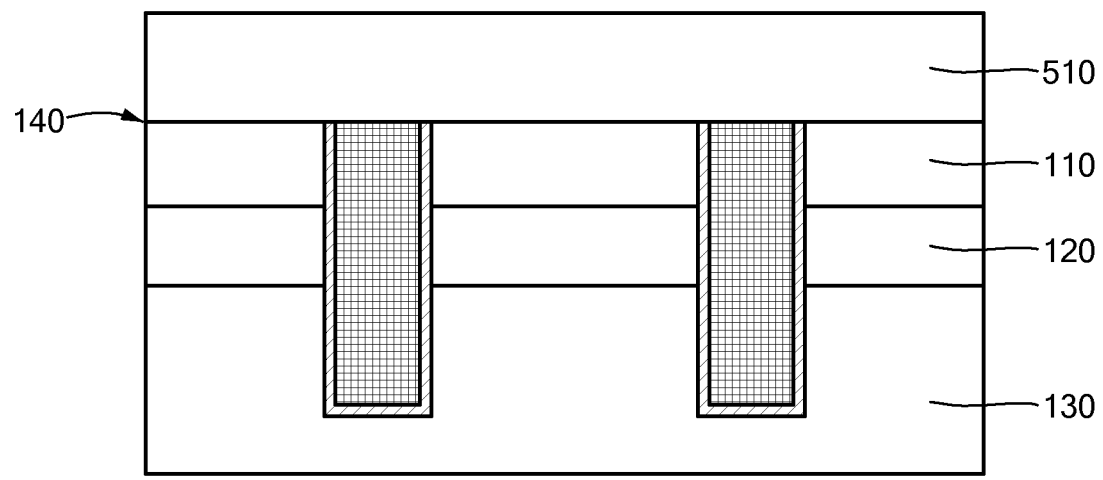
FIG. 5 is a schematic diagram showing a handling wafer bonded directly or indirectly to the top surface of the SOI wafer.

FIG. 5 is a schematic diagram showing a handling wafer 510 bonded directly or indirectly to the top surface 140 of the SOI wafer 100. For example, one or more material layers may be present between the top surface 140 and the handling substrate 150, such as an adhesive layer and/or a protective layer (not shown for convenience). Use of a handling wafer may be omitted in certain embodiments.

Figure 6:
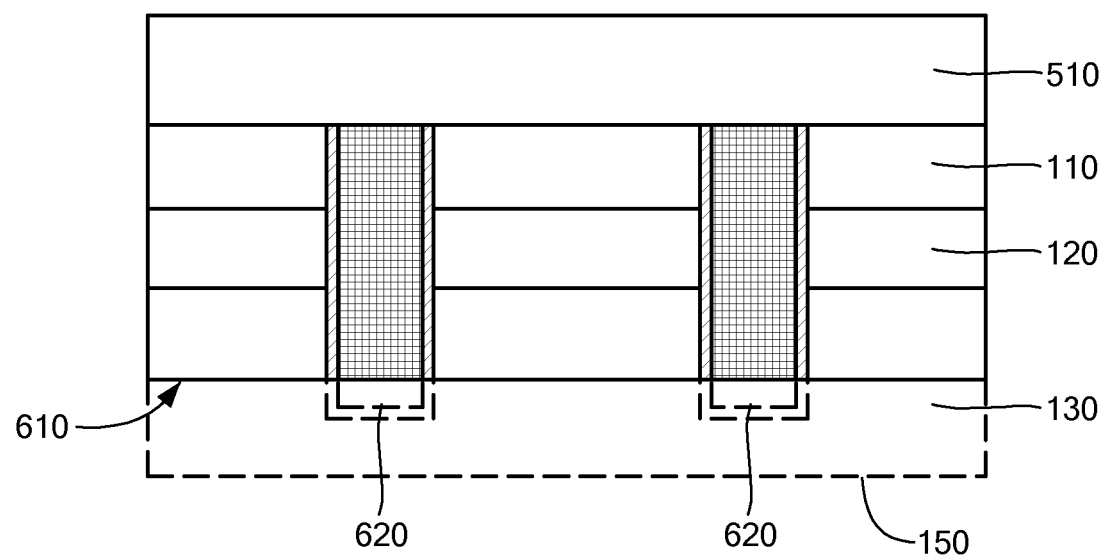
FIG. 6 is a schematic diagram showing the wafers following back side grinding of the surface to form a surface through which the filled, lined trenches are exposed.

FIG. 6 is a schematic diagram showing the wafers following back side grinding of the surface 150 to form a surface 610 through which portions of the filled, lined trenches 210 are exposed. The materials outlined in dashed lines, including portions 620 of the filled, lined trenches 210, have been removed during the grinding process.

Figure 7:
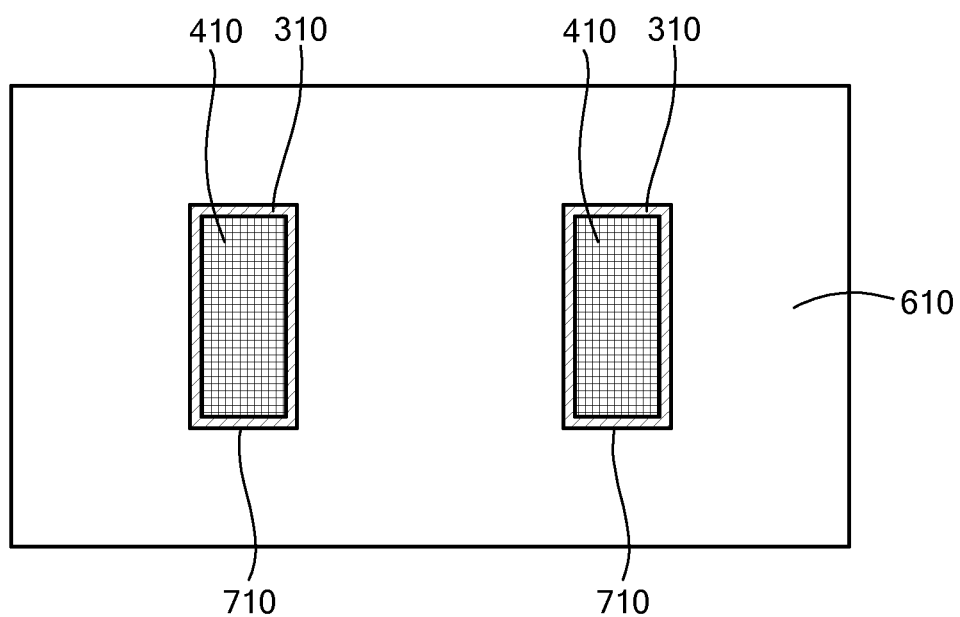
FIG. 7 is a schematic diagram showing a bottom side view of the surface showing the exposed trenches.

FIG. 7 is a schematic diagram showing a bottom side view of the surface 610 showing exposed portions 710 of the filled, lined trenches 210. The contrasting material 310 now can be used as alignment references for a standard stepper tool for precise alignment of the SOI wafer during back side processing the SOI wafer. As mentioned above, the protective material 410 may prevent contamination from materials used during various fabrication processes and, in some embodiments, may be used for electrically conductive vias.

Figure 8:
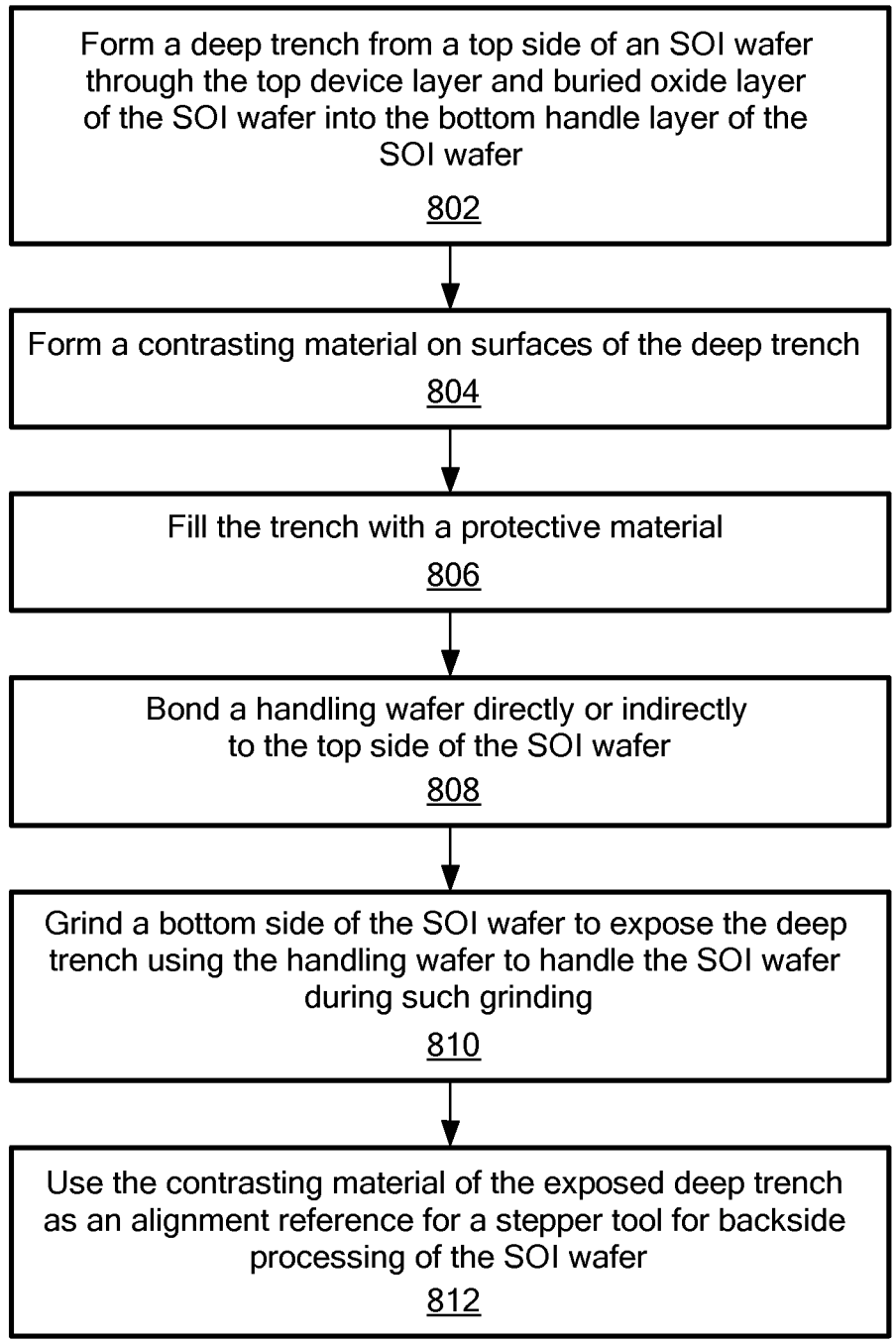
FIG. 8 is a logic flow diagram for an exemplary method of fabricating and using alignment features in accordance with the fabrication process described above with reference to FIGS. 1-7.

FIG. 8 is a logic flow diagram for an exemplary method of fabricating and using alignment features in accordance with the fabrication process described above with reference to FIGS. 1-7. In block 802, a deep trench is formed from a top side of an SOI wafer through the top device layer and buried oxide layer of the SOI wafer into the bottom handle layer of the SOI wafer. In block 804, a contrasting material is formed on surfaces of the deep trench. In block 806, the trench is optionally filled with a protective material. In block 808, a handling wafer is optionally bonded directly or indirectly to the top side of the SOI wafer. In block 810, a bottom side of the SOI wafer is ground to expose the deep trench, optionally using the handling wafer to handle the SOI wafer during such grinding. In block 812, the contrasting material of the exposed deep trench is used as an alignment reference for a stepper tool for backside processing of the SOI wafer, for example, by aligning the wafer in a wafer processing machine for back side processing of the wafer, wherein the wafer processing machine includes a stepper tool, and wherein the contrasting material of the exposed trench is an alignment reference used by the stepper tool to align the wafer.

It should be noted that, for the sake of simplicity and convenience, the fabrication of alignment features is described above independently of the fabrication of wafer devices (e.g., MEMS devices or CMOS devices). During an actual fabrication process flow, the alignment features generally would be fabricated alongside fabrication of the devices themselves. For example, an etching/patterning process used to form part or all of a trench also may be used to form components of the wafer device, and a process used to form the contrasting material on surfaces of the trench or fill the trench also may be used to form components of the wafer device. Thus, when the trenches are being etched, other features for the wafer devices may be etched; when the trenches are being lined, other features for the wafer devices may be lined; when the trenches are being filled, other features for the wafer devices may be filled; etc. The overall fabrication process flow therefore typically includes many fabrication steps, and fabrication of the alignment features may (and typically does) involve many other steps than the ones described above with reference to FIGS. 1-7. Thus, fabrication of the alignment features typically is designed into the overall process flow using existing process steps and/or additional process steps, and therefore different embodiments may form similar alignment features through different fabrication steps. Also for the sake of simplicity and convenience, details of back side processing of wafer devices (other than the grinding of the bottom handle wafer) are omitted, as such processing generally would depend on the type of device being fabricated and generally is independent of the fabrication of alignment features and use of the alignment features to align the wafer for back side processing.

It should be noted that the alignment features may be formed in any of a variety of shapes or sizes as might be warranted by a particular embodiment. Thus, for example, alignment features may be square, round, rectangular, or other shape, and may be thick or thin.

It should be noted that, in some embodiments, formation of the contrasting material on surfaces of a trench may sufficiently fill the trench such that the step of filling the trench with protective material can be omitted. Thus, in some embodiments, such filling of the trenches may be considered optional or unnecessary.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A method for forming an alignment feature for back side wafer processing, the method comprising:
   forming a trench into but not entirely through a wafer from a top side of the wafer;
   forming a contrasting material on surfaces of the trench;
   grinding a bottom side of the wafer to expose the trench, wherein the contrasting material lining the exposed trench provides an alignment reference for precise alignment of the wafer for back side processing the wafer; and
   aligning the wafer in a wafer processing machine for back side processing of the wafer, wherein the wafer processing machine includes an alignment tool, and wherein the contrasting material of the exposed trench is an alignment reference used by the alignment tool to align the wafer.

2. A method according to claim 1, wherein the contrasting material includes at least one of an oxide or a nitride.

3. A method according to claim 2, wherein the contrasting material is formed by oxidation or deposition.

4. A method according to claim 1, further comprising:
   filling the trench with a protective material after forming the contrasting material.

5. A method according to claim 4, wherein the protective material includes at least one of:
   polysilicon; or
   an electrically conductive material.

6. A method according to claim 1, wherein grinding the bottom side of the wafer to expose the trench comprises:
   bonding a handling wafer directly or indirectly to the top side of the wafer; and
   using the handling wafer to handle the wafer during such grinding.

7. A method according to claim 1, wherein the wafer is one of a number of wafers in a wafer stack.

8. A method according to claim 1, wherein the wafer is a silicon-on-insulator (SOI) wafer, and wherein the trench extends through a top device layer and a buried oxide layer of the SOI wafer into, but not completely through, a bottom handle layer of the SOI wafer.

9. A method according to claim 1, wherein the alignment feature is placed in a scribe area of the wafer that is excluded from wafer devices formed from the wafer.

10. A method according to claim 1, wherein the alignment feature is included in a wafer device formed from the wafer.

* * * * *